United States Patent [19]

Guérin-Pinaud

[11] Patent Number: 4,580,082

[45] Date of Patent: Apr. 1, 1986

[54] METHOD AND DEVICES FOR DETECTING WHETHER A DIRECT-CURRENT MOTOR HAS SLOWED-DOWN AND A MOTOR EQUIPPED WITH A DEVICE OF THIS TYPE

[75] Inventor: Jacques Guérin-Pinaud, Evreux, France

[73] Assignee: Etudes Techniques et Representations Industrielles E.T.R.I., Neuilly-sur-Seine, France

[21] Appl. No.: 722,981

[22] Filed: Apr. 15, 1985

Related U.S. Application Data

[63] Continuation of Ser. No. 584,390, Feb. 28, 1984.

[30] Foreign Application Priority Data

Mar. 18, 1983 [FR] France .................. 83 04446

[51] Int. Cl.⁴ .................. H02K 29/00; H02P 5/16
[52] U.S. Cl. .................. 318/331; 318/318; 318/439; 318/257; 318/341; 318/138
[58] Field of Search .............. 318/318, 319, 331, 332, 318/434, 439, 257, 254, 314, 317, 139, 327, 341, 345 A, 138

[56] References Cited

U.S. PATENT DOCUMENTS

| | | | |
|---|---|---|---|
| 3,343,036 | 9/1967 | Steen | 361/92 |
| 3,346,725 | 10/1967 | Allured et al. | 324/177 X |
| 3,414,791 | 12/1968 | Munson et al. | 318/331 |
| 3,611,081 | 10/1971 | Watson | 318/331 X |
| 3,745,435 | 7/1973 | Futagawa et al. | 318/254 |
| 3,750,000 | 7/1973 | Bruckner et al. | 318/138 X |
| 3,813,591 | 5/1974 | Dinger | 318/331 |
| 3,829,749 | 8/1974 | Richt | 318/138 X |
| 3,938,014 | 2/1976 | Nakajima | 318/138 |
| 4,030,005 | 6/1977 | Doemen . | |
| 4,070,606 | 1/1978 | Morozumi et al. | 318/138 X |
| 4,172,990 | 10/1979 | Everett et al. | 318/138 X |
| 4,262,237 | 4/1981 | Gelenius | 318/254 |
| 4,446,406 | 5/1984 | Uzuka | 318/138 X |

FOREIGN PATENT DOCUMENTS

| | | | |
|---|---|---|---|
| 2269232 | 11/1975 | France . | |
| 43-18673 | 8/1968 | Japan | 324/177 |
| 57-88888 | 6/1982 | Japan . | |

OTHER PUBLICATIONS

James B. Tiedemann, "Permanent-Magnet Motor Measures its own Speed", *Electronics*, vol. 40, p. 84, May 29, 1967.

Primary Examiner—William M. Shoop, Jr.
Assistant Examiner—Shik Luen Paul Ip
Attorney, Agent, or Firm—Young & Thompson

[57] ABSTRACT

The direct-current motor comprises at least one field winding supplied intermittently with direct-current voltage in order to produce a driving torque by interaction with permanent-magnetic poles which rotate with respect to the winding. The electromotive force of induction produced in the winding by the relative rotation of the permanent-magnetic poles is detected by means of a voltage measurement during the time intervals which elapse when the winding is not energized. A low-speed signal is produced when the electromotive force is below a pre-established threshold in correlation with the desired speed-threshold value.

8 Claims, 2 Drawing Figures

FIG_1

METHOD AND DEVICES FOR DETECTING WHETHER A DIRECT-CURRENT MOTOR HAS SLOWED-DOWN AND A MOTOR EQUIPPED WITH A DEVICE OF THIS TYPE

This application is a continuation of application Ser. No. 584,390, filed 2/28/84.

This invention relates to a method and a device for detecting whether a direct-current electric motor has slowed-down and more specifically for detecting whether its speed is below a predetermined threshold value. The invention also relates to a motor equipped with a device of this type.

Motors of this type are usually provided with at least one motor winding and with permanent-magnetic field poles designed for rotation with respect to the motor winding.

In order that the rotor should be subjected at least on an average to a driving torque in the desired direction of rotation, the supply of current to the winding and/or the direction of the current within the winding must be determined at each instant as a function of the angular position of the rotor. Means are therefore provided for successively opening and closing a supply circuit for the winding as a function of the angular position of the rotor with respect to the stator.

In some applications, it is necessary to detect whether the speed of the rotor is falling below a predetermined threshold value. In particular, it may be necessary to protect the motor against an excessive load. In fact, when the speed of the rotor is low for any reason such as braking or jamming, for example, the supply circuit remains excited in the same winding over a period of time which may cause damage to the circuits as a result of overheating of the conductors.

The aim of this invention is to remove these disadvantages by providing a method and a device for detecting whether the speed of the rotor is below a predetermined threshold value and for producing a signal when such a decrease in speed is detected. This signal can serve both to provide a warning and to ensure protection of the motor.

In the method under consideration for detecting whether the speed of the rotor of a direct-current motor is below a predetermined threshold value, said direct-current motor comprises at least one field winding supplied intermittently with direct-current voltage in order to produce a driving torque by interaction with permanent-magnetic poles which rotate with respect to the winding.

The method in accordance with the invention essentially consists in detecting by means of a voltage measurement, during the time intervals which elapse when the winding is not energized, the electromotive force of induction produced in the winding by the relative rotation of the permanent-magnetic poles and in producing a low-speed signal when said electromotive force is lower than a pre-established threshold in correlation with the desired speed-threshold value.

The invention arises from the discovery that, in a motor of the type considered, the rotation of the magnetic poles with respect to the winding determines in this latter an electromotive force of induction which it is possible to detect by voltage measurement during the time intervals which elapse when the winding is not supplied. The electromotive force of induction thus produced is a function of the rotor speed and disappears when the rotor is stationary. In accordance with the invention, the phenomena just explained are utilized for the purpose of generating a low-speed signal when it is observed that the electromotive force of induction is lower than the predetermined threshold value which has been set as a safety level.

This signal can then be utilized as desired, for example for the purpose of operating a warning device and/or for the purpose of interrupting the voltage supply to the windings if the intended function of the device is to protect the motor against overloading or jamming.

In an advantageous manner, interruption of the supply is delayed during a time interval $t_1$ with respect to the decrease in electromotive force below the predetermined threshold value.

This makes it possible to avoid the need to add a special circuit for the necessary purpose of starting the motor which has to be supplied in this case although the speed of the rotor is lower than the predetermined threshold value.

Certain uses of this type of motor entail the need for progressive application of voltage to the motor. The value selected for the time interval $t_1$ must therefore be sufficient to ensure that the supply is maintained beyond the time required for the rotor to overstep the speed threshold.

This time delay $t_1$ also serves to prevent failures of supply in the event of transient speed reductions arising from momentary overload of the rotor.

In a preferred embodiment of the invention, suppression of the low-speed signal is followed by reestablishment of the supply to the windings at the end of a time delay $t_2$ after its interruption.

The value chosen for the time interval $t_2$ will advantageously be high in comparison with the value $t_1$ in order to ensure that the mean current intensity within the circuits which results from the jamming overcurrent which flows during the time interval $t_1$ and from the zero current during the time interval $t_2$ does not cause any damage as a result of overheating of the conductors.

One application of this method to a motor in which the number of open switches is the same irrespective of the position of the rotor is distinguished by the fact that voltage measurements are performed at measurement points A each located between one of the windings and the corresponding controlled switch. This switch is connected between the associated measurement point and a supply terminal which is brought to a first direct-current potential $V_1$ whereas the winding is mounted between the associated measurement point A and a supply terminal which is brought to a second direct-current potential $V_2$, this potential being different from the first. Another feature of this application lies in the fact that these measurements are combined in a characteristic value which varies in the same direction when, all other things being equal, the potential at any one measurement point varies from the first potential to the second potential.

The characteristic value is thus a characteristic function of the electromotive force induced in the non-supplied winding or windings and makes it possible to generate the low-speed detection signal.

For example, when the method is applied to a motor having n windings in which it is desired to perform a measurement and n associated measurement points ($A_1 \ldots A_n$), the characteristic value can be a monotonic function of the expression $$\sum_{A1}^{An} \frac{VA - V1}{V2 - V1},$$

where VA represents the potential at the measurement point considered (A1 ... An), where V1 represents the first direct-current potential and V2 represents the second direct-current potential.

According to another aspect of the invention, the device for carrying out the method considered in the foregoing is distinguished by the fact that a coupling resistor for connecting the corresponding measurement point A to a common node M is associated with each field winding on which it is desired to perform a voltage measurement, the value of the coupling resistors $R_L$ being proportional to the difference (V2−V1) between the second and the first direct-current potentials in the different windings so that the potential at the common node $M_l$ is a linear function of $$\sum_{A1}^{An} \frac{VA - V1}{V2 - V1}$$

and constitutes the characteristic value.

For example, in the frequent case where the motor has n measured windings which can all be supplied between the same direct-current potentials V1=O and V2, where m designates the number of open switches, where the reference $R_A$ designates the value of the supplementary resistor which connects the node M to the potential V1, and where the coupling resistors $R_L$ all have the same value, the device will advantageously be distinguished by the fact that it comprises means for comparing the potential at the common node with a reference potential $$V_H(1 + a)\frac{m R_A}{nR_A + R_L} V2$$

a being a positive number of small value with respect to 1.

In this frequent case, the potential at the common node M becomes equal to $$\left(1 + \frac{emf}{V2}\right) \frac{m R_A}{nR_A + R_L} \cdot V2$$

When the electromotive force induced by the rotation of the rotor falls below the predetermined threshold a×V2, it is only necessary to compare the potential at the common node with the pre-established reference potential in order to produce the low rotor-speed signal when necessary, this comparison being made by known means such as electronic voltage comparators.

Other features of the invention will be more apparent to those skilled in the art upon consideration of the following description and accompanying drawings, wherein.

Figure 1:
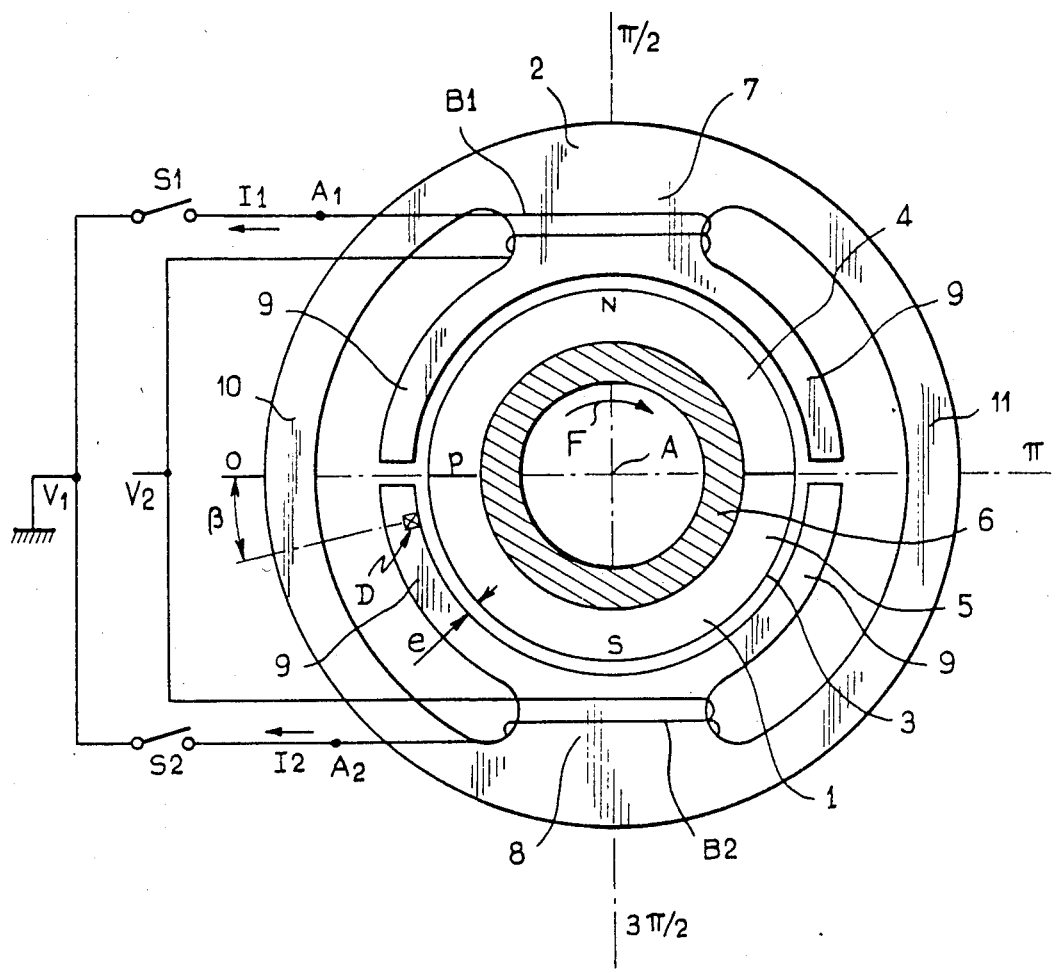
FIG. 1 is a schematic axial view showing the rotor and the stator of a motor in accordance with the invention.

FIG. 1 shows a particular example of a motor in which the rotor 1 having an axis A drives permanent magnets 4, 5 and in which the stator 2 carries the windings B1, B2, of the type used for fan motors in electrical equipment cubicles.

The rotor 1 has an external surface of revolution 3 formed by two permanent magnets 4 and 5 bonded to a tubular core 6 and provided respectively with north and south poles on said external surface. These north and south poles each occupy approximately one-half the circumference of the rotor. The other pole of each magnet 4, 5 is directed towards the axis A.

The stator 2 comprises two pole regions 7 and 8 which are diametrically opposite with respect to the rotor and are widened-out within the interior so as to form pole horns 9. Thus each pole region embraces practically one-half the perimeter of the rotor 1 with a constant airgap e. The pole horns are joined together at the exterior by means of two arms 10 and 11 which close the magnetic circuit between the pole regions.

The pole regions 7 and 8 are surrounded respectively by windings $B_1$ and $B_2$ which, in the schematic representation of FIG. 1, can be supplied with current by closing two switches $S_1$ and $S_2$ respectively. When the winding $B_1$ is energized, the regions 7 and 8 become respectively the south pole and north pole and the rotor tends to take up the position shown in FIG. 1 in which the magnet 4 is located opposite to the region 7. When the winding $B_2$ is energized, the regions 7 and 8 become respectively the north pole and the south pole. In the case of the rotor, this corresponds to a position of equilibrium which is symmetrical with the preceding.

A detector D for detecting the position of the rotor is placed at the front end of the stator and opposite to the cylindrical surface formed by the rotor magnets 4 and 5. The detector D is placed near the end of one of the horns of the pole region 8 and is displaced by a small angle β in the trigonometric direction with respect to the axial plane 0,π which is perpendicular to the axis of π/2, 3π/2 of the stator poles.

In FIG. 2, there are again shown the windings $B_1$ and $B_2$, the detector D and two Darlington-pair npn transistors having a double stage $T_1$ and $T_2$ constituting the switches $S_1$ and $S_2$.

One end of each motor winding $B_1$ and $B_2$ is connected to the positive supply terminal $V_2$ of the motor, said terminal being separated from the source, $V_{supply}$ ($V_{alim}$) by a diode $D_1$ which has the function of protecting the circuit assembly against polarity reversals.

The other end $A_1$, $A_2$ of the windings $B_1$, $B_2$ is connected to the collector of the transistors $T_1$ and $T_2$ respectively. The emitter of this transistor pair is connected to the ground $V1_1$ which represents the negative input terminal of the motor and will be taken as an origin for the potentials ($V_1$=o).

In conjunction with the detector D shown in FIG. 1, the transistors $T_1$ and $T_2$ form the essential part of switching means 22 for successively opening and closing the supply circuits of the windings $B_1$ and $B_2$ as a function of the angular position of the rotor.

The detector D essentially comprises a Hall generator 31 which is sensitive to the magnetic field and an npn transistor 32, the emitter of which is connected to the negative input terminal 21 of the generator and the base of which is connected to one of the outputs of this latter. The collector of the transistor 32 constitutes the output 103 of the detector D. This detector is supplied by a line 23 at a stabilized voltage VR which is independent of the variations in the motor supply voltage $V_{supply}$ and is delivered at the common node between a Zener diode $Z_1$ and a resistor $R_1$ which are mounted in series between the terminal $V_2$ and ground $V_1$. The output of the detector D is connected to the line 23 through a resistor $R_{13}$ and to the base of the transistor $T_1$ through a resistor $R_9$ whilst two resistors in series $R_{10}$ and $R_{11}$ join the collector of the transistor $T_1$ to the base of the transistor $T_2$.

Two suppressor capacitors $C_1$, $C_2$ are mounted in parallel with the collector-base paths of the transistors $T_1$ and $T_2$ respectively.

The motor in accordance with the present invention further comprises a low-speed detection circuit 24. Among other components, this circuit makes use of two comparators $IC_1$ and $IC_2$ each having one reversing input (negative sign — in the diagram), one non-reversing input (positive sign +), a supply 104, 108 and an output 109, 110.

When the potential of the reversing input of a comparator ($IC_1$ or $IC_2$) is higher than that of the non-reversing input, the output is connected to its supply potential (108, 104).

In the contrary event, the output is disconnected from the supply, with the result that the output potential is determined solely by the circuit downstream of the comparator.

To this end, the reversing input of the comparator $IC_1$ which is subjected to a reference voltage $V_H$ is connected to the common node of a voltage divider $R_2$, $R_3$ and this latter is connected between the supply terminals $V_2$ and $V_1$. The non-reversing input of the comparator $IC_1$ is connected to the common node M between coupling resistors $RL_1$, $RL_2$ which are mounted in series between the ends $A_1$, $A_2$ of the windings $B_1$, $B_2$.

The non-reversing input of the comparator $IC_1$ is also connected to ground $V_1$ through a resistor $R_A$ and a capacitor $C_A$ which are mounted in parallel.

The output 109 of the comparator $IC_1$ is connected through a resistor $R_5$ to the stabilized voltage $V_R$ and through a resistor $R_6$ to the reversing input of the second comparator $IC_2$, the supply of which is at the voltage $V_1 = o$ as in the case of the comparator $IC_1$. The non-reversing input of said comparator $IC_2$ is connected to the stabilized voltage $V_R$ through a resistor $R_7$ and to its output 110 through a resistor $R_8$. An electrolytic capacitor $C_3$ is mounted between the voltage $V_R$ and the reversing input of the comparator $IC_2$. The output 110 of the comparator $IC_2$ is connected to the base of an npn transistor $T_3$, the emitter 112 of which is connected to ground $V_1$ and the collector 111 of which is connected to the node 121, said node being common to the two cathodes of two diodes $D_2$ and $D_3$. The anode of the diode $D_2$ is connected to the output 103 of the position detector D whilst the anode of the diode $D_3$ is connected to the common node between the resistors $R_{10}$ and $R_{11}$.

The operation of the motor in accordance with the arrangements described in the foregoing is as follows:

Postulating that the transistor $T_3$ is in the non-conducting state for reasons which will be explained hereinafter and that the rotor 1 is rotating, the detector D changes alternately from $V_1 = o$ to $V_R$ and conversely as a function of the position of the rotor 1, the magnetic field of which produces action alternately in one direction or in the other on the Hall generator 31 which is sensitive to the magnetic field and the low-power binary output of which is $V_R$ or $V_1 = O$.

When the output 103 of the detector D is at zero potential, the transistor $T_1$ is in the non-zero conducting state. In consequence, no current flows through the winding $B_1$ and the point $A_1$ is thus at a higher potential than $V_1$, with the result that the transistor $T_2$ is driven into saturation via the resistors $R_{10}$ and $R_{11}$. The transistor $T_2$ is thus triggered into conduction and a current $I_2$ passes through the winding $B_2$ which is energized. When the output 103 is at the potential $V_R$, the transistor $T_1$ is in the conducting state, with the result that the point $A_1$ is at the potential $V_1$, the transistor $T_2$ is cut-off and only the winding $B_1$ is energized and carries a current $I_1$.

It will first be postulated from a study of FIG. 1 that, when the detector D is located opposite to the north field pole of the rotor, the winding $B_1$ is energized and sets up a south field pole in region 7, and that the rotor rotates in the direction of the arrow F (clockwise direction). When a generator-line located between the poles of the rotor passes in front of the detector D, there is then initiated a process whereby one of the winding supply circuits opens and the other closes.

The detector D is positioned with a lead angle $\beta$ with respect to the plane $0, \pi$ in order to take into account short switching delays and especially the delay in variation of currents within the windings $B_1$, $B_2$. Accordingly, the magnetic field produced by the windings always gives rise to a motor torque in the direction of the arrow.

In order to satisfy the condition of sustained rotation, it is only necessary to ensure that the transistor $T_3$ is cut-off.

If the transistor $T_3$ changes to the conducting state, the output 103 of the detector D and the node which is common to the resistors $R_{10}$ and $R_{11}$ are maintained at the voltage $V_1$, with the result that the transistors $T_1$, $T_2$ are cut-off and the entire current supply to the windings $B_1$, $B_2$ is interrupted irrespective of the magnetic field applied to the detector D.

The state of the transistor $T_3$ is controlled by the low-speed detection device 24 in accordance with the invention, the operation of which will now be described.

When the motor is rotating normally, the motor torque is maintained as has been seen earlier because the ends $A_1$, $A_2$ of the windings are alternately connected to ground $V_1$ or left free.

In the second case, the end A (namely either $A_1$ or $A_2$) of the winding ($B_1$ or $B_2$) is at the potential $V_2$ increased by an electromotive force (emf) induced in the winding by the rotating magnets 4, 5.

This emf is always added to the voltage $V_2$. For example, if $V_1 = o$, $V_2$ positive, this emf will be positive.

In fact, in the energized winding which generates the motor torque, the induced counter emf reduces the voltage $V_2$ to zero, subject to line losses. On the contrary, in the non-energized winding, the emf is added to the voltage $V_2$.

If the motor rotates at low speed, this induced emf becomes weak and the potential becomes $V_2 + V_a$, where $V_a$ is of low value compared with the induced emf at normal speed.

Irrespective of the configuration of the motor and its state at a given instant, the principle of the present invention consists in detecting when the value of emf induced in the non-energized windings falls below a predetermined threshold value, thus making it possible to produce a signal for indicating that the angular velocity of the rotor is below a predetermined threshold value.

In the first example described (with reference to FIG. 2), the points A ($A_1$, $A_2$) are connected to a common node M through coupling resistors $R_L$ ($R_{L1}$, $R_{L2}$) having a high resistance value. Said node M is connected to the ground potential $V_1$ through a supplementary resistor $R_A$. For example, if all the coupling resistors $R_L$ ($R_{L1}$, $R_{L2}$) are of equal value, the potential of the node M is representative of the sum of potentials at the points A, $V_M = k\Sigma V_A$, where k is a constant number determined by the relative values of the resistors $R_L$ and $R_A$.

By comparing the potential $V_M$ with the pre-established potential $V_H$ by means of the comparator $IC_1$, it is possible to generate a signal at the output 109 of the comparator $IC_1$ which indicates whether the motor is rotating at a normal speed (output in the free state) or whether the motor is rotating at a speed below a predetermined threshold value (output connected to $V_1$).

This signal can be employed, for example, for directly interrupting the supply of current to the motor. However, in order to avoid untimely failures arising from transient conditions, arrangements are made in the example illustrated to set a time delay on this interruption of current. This also permits startup of the motor without being obliged to provide a special device for putting the starting-speed monitoring system out of service. To this end, the output 109 of the comparator $IC_1$ corresponding to low speed is at the potential $V_1$ ($V_1 = o$). The high-value capacitor $C_3$ such as an electrolytic capacitor, for example, is between the potentials $V_1$ and $V_R$ and is charged through the resistor $R_6$.

When, after a charging time $t_1$, the terminal voltage of the capacitor $C_3$ exceeds the terminal voltage of the resistor $R_7$, namely $$\frac{R_7}{R_7 + R_8} V_R,$$

the output 110 of the comparator $IC_2$ is released and the base of the transistor $T_3$ is connected to the potential $V_R$ through the resistors $R_7$, $R_8$ and $R_{12}$. The transistor $T_3$ is triggered into conduction, thus cutting-off the transistors $T_1$ and $T_2$ and consequently interrupting the supply of current to the windings $B_1$ and $B_2$ independently of the state of the detector D.

When the transistors $T_1$ and $T_2$ are cut-off simultaneously, the points $A_1$ and $A_2$ are both at the potential $V_2$, the comparator $IC_1$ changes state (output 109 at $V_1 = O$) and the capacitor $C_3$ is discharged through the resistors $R_5$ and $R_6$. After a discharge time $t_2$, the capacitor $C_3$ applies to the reversing input of the comparator $IC_2$ a potential of lower value than the potential of its non-reversing input, which is now close to the potential $V_R$ and defined by the voltage divider which is constituted on the one hand by the resistors $R_7$, $R_8$, $R_{12}$ and on the other hand by the base-emitter resistor of the transistor $T_3$. The comparator $IC_2$ again changes state and cuts-off the transistor $T_3$, thus permitting the supply of current to the windings. This cycle is repeated as long as the cause of excessive current remains (such as braking of the rotor, for example). Thus the windings are alternately energized during a time interval $t'_1$ which is slightly shorter than the initial time interval $t_1$ since the minimum voltage of the capacitor $C_3$ is no longer zero, and non-energized during the time interval $t_2$. The resistors $R_5$ and $R_6$ constitute with the capacitor $C_3$ a timing circuit which is intended to introduce the time delay $t_1$ (eventually $t'_1$) or the time delay $t_2$ between the change of state of the comparator $IC_1$ and the change of state of the comparator $IC_2$. Said resistors $R_5$ and $R_6$ are chosen so as to ensure that the time delay $t_2$ is of relatively long duration with respect to the time delays $t_1$ or $t'_1$, the ratio being of the order of 10 seconds to 1 second, for example. In consequence, the mean current within the windings is sufficiently small to avoid any damage. If the disturbing cause disappears, the motor starts up spontaneously.

It is possible to collect at the output of the comparator $IC_2$ a binary signal which has one value (zero) when the windings $B_1$, $B_2$ are energized in succession and which has the other value in the vicinity of $V_R$ when said windings are not energized.

At the time of startup, the speed is zero and then low. The induced emf is also weak and the voltage at M is below the threshold value $V_H$ as long as the speed of the rotor has not exceeded the speed threshold. The value chosen for the time delay $t_1$ is larger than the time taken by the rotor 1 to increase from zero speed to a speed which is higher than the predetermined speed threshold.

In the device herein described, the same measurement of voltages in two windings makes it possible on the one hand to produce the low-speed signal after a first time delay $t_1$ and on the other hand to suppress this signal after a second time delay $t_2$ in order that the motor may re-start spontaneously when the cause of jamming has been removed. To this end, the measurement must be carried out on at least two windings while ensuring that at least one of the two windings is supplied with current at each instant. If this condition is not observed and jamming occurs while the winding or windings considered are not energized, it would not be possible to detect the interruption of the supply if this latter takes place through the same switch as normal commutation.

Should it be desired to detect jamming of the rotor in the circuit described above by measuring the potential of the point $A_1$ alone, the value measured could be the maximum value of this potential in time. This maximum value is higher than $V_2$ when the rotor is rotating. When the rotor is braked, the potential is constant and equal to zero or to $V_2$ according as the transistor $T_1$ is in the conducting state or not and therefore does not exceed $V_2$, thus making it possible to detect jamming. On the other hand, if the transistor $T_1$ is in the cut-off state, the conduction of transistor $T_3$ does not have any effect on the winding $B_1$ and the jamming signal cannot be suppressed.

Should it be desired to maintain the jamming signal after its appearance or if suppression of the signal is produced by other means, it is possible to carry out the voltage measurement on a single winding which is energized intermittently or on a number of windings which can all be disconnected simultaneously.

The same applies if the interruption of current supply initiated by the braking signal is produced by means of a special switch independently of the commutation switches since this interruption is liable to modify the potential measured on a non-energized winding. It is a fact that, in the device herein described, the jamming signal has the effect of opening switches $T_1$ and $T_2$ which normally serve to supply voltage successively to the windings. But the invention is independent of any switching circuit and is applicable in particular to motors having rotating windings and stationary magnets with commutation by means of commutator and brush assemblies. In this case, any interruption of the current supply necessarily takes place by means of a switch that is independent of the commutator.

Interruption of the current supply is not always necessary. The invention can be utilized solely in order to indicate braking of the motor, especially when this latter is capable of withstanding the resultant overcurrents without any damage.

Figure 2:
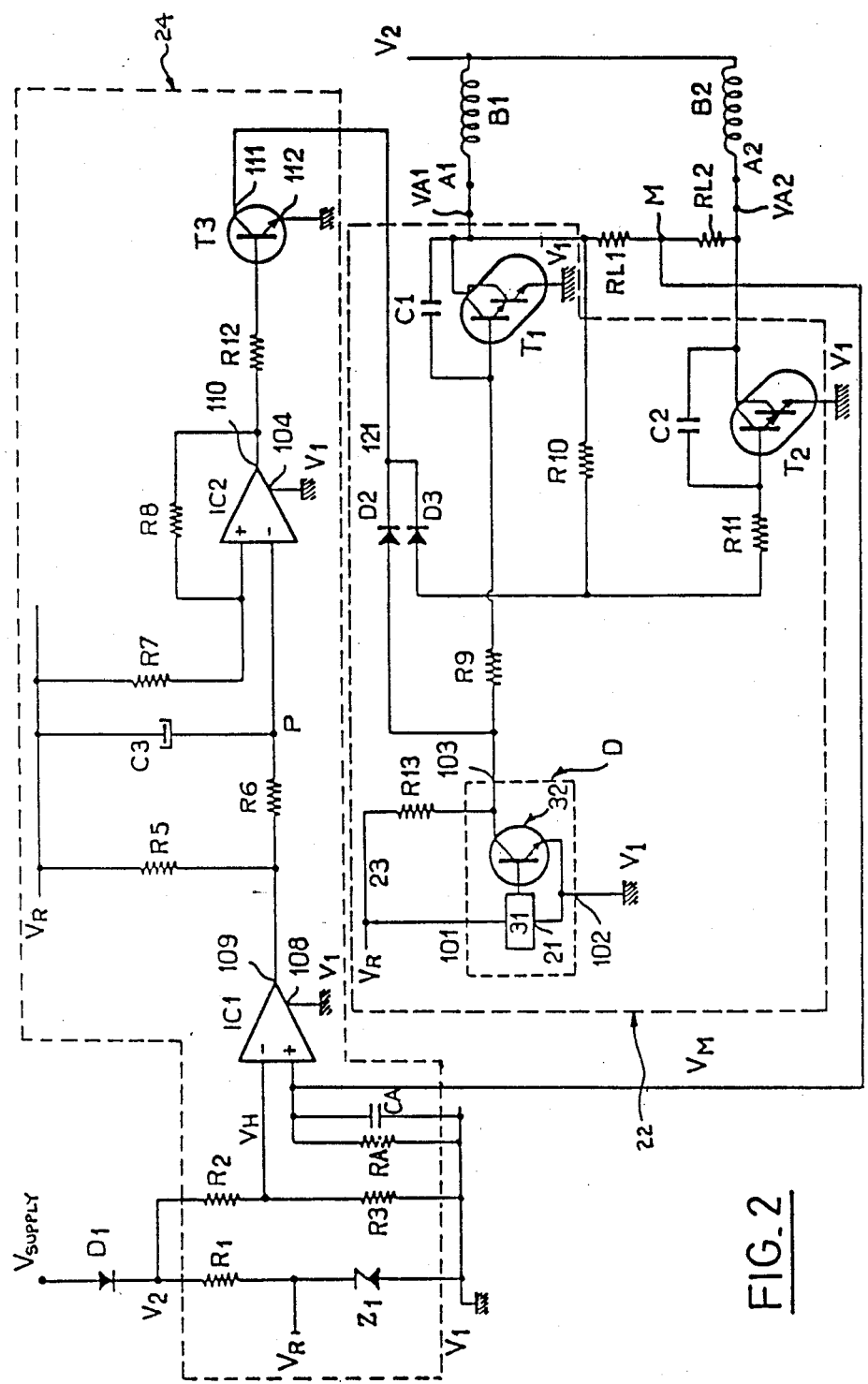
FIG. 2 is a schematic diagram of the switching circuit of a motor in accordance with the invention.

In the example of FIG. 2, the resistors $R_{L1}$ and $R_{L2}$ are of equal value, with the result that the voltage $V_M$ is the same in respect of a given speed of the rotor, whether the winding $B_1$ or $B_2$ is energized. The voltage $V_M$ can therefore be assimilated with a characteristic value G of the speed of rotation of the rotor 1.

In a broader sense, if consideration is given to a motor in which the voltages $V_{Ai}$ are measured at n points $A_i$ located respectively between windings $B_i$ and the corresponding switches $T_i$, in which a constant number m of these switches are opened at each instant and in which each switch $T_i$ is connected between the point $A_i$ and a supply terminal at a first potential $V1_i$ whilst the winding $B_i$ is connected between the point $A_i$ and another supply terminal at a second potential $V2_i$, it is possible to detect an abnormally low speed of this motor by combining these measurements in a quantity G which is a monotonic function of $$\sum_{1}^{n} \frac{VA_i - V1_i}{V2_i - V1_i},$$

that is, a function which always varies in the same direction when this sum increases. In fact, when the motor is supplied with current and is at a standstill $$\frac{VA_i - V1_i}{V2_i - V1_i}$$

is equal to 1 in the case of the m non-energized windings and is at zero in the case of the n−m energized windings, the sum being therefore equal to m. When the motor rotates, the fraction is larger than 1 in the case of the m non-energized windings (the induced emf is added at absolute value to the supply voltage) and is always zero in the case of the other windings, with the result that the sum is larger than m and larger as the emf values and consequently the speed of the motor are higher. The quantity G therefore deviates from its value at standstill to a greater extent as the speed is higher and thus constitutes an image of this speed, which makes it possible to detect a low speed by monitoring.

The quantity G aforesaid can be supplied when the supply voltages $V2_i - V1_i$ of the different windings all have the same sign, by the potential $V_M$ at a node M connected to the points $A_i$ through resistors $RL_i$, the values of which are proportional to the voltages $V2_i - V1_i$, whence $RL_i = k (V2_i - V1_i)$. The node M can also be connected through a supplementary resistor RA to a point having a constant potential $V_o$. Accordingly, we obtain from Kirchhof's node current law:

$$\sum_{1}^{n} \frac{VM - Va_i}{RL_i} + \frac{VM - V_o}{RA} = 0$$

(when the connection at the constant potential does not exist, RA is infinite and the second term is zero).

$$VM \left( \sum_{1}^{n} \frac{1}{RL_i} + \frac{1}{RA} \right) = \sum_{1}^{n} \frac{VA_i}{RL_i} + \frac{V_o}{RA} =$$

$$\frac{1}{k} \sum_{1}^{n} \frac{VA_i}{V2_i - V1_i} + \frac{V_o}{RA}$$

VM is therefore a linear and consequently monotonic function of $$\sum_{1}^{n} \frac{VA_i}{V2_i V1_i}$$

and consequently of:

$$\sum_{1}^{n} \frac{VA_i - V1_i}{V2_i - V1_i} = \sum_{1}^{n} \frac{VA_i}{V2_i - V1_i} - \sum_{1}^{n} \frac{V1_i}{V2_i - V1_i}$$

since the terms $$\frac{V1_i}{V2_i - V1_i}$$

are constant.

The variations of emf in the windings which arise from the variations in flux of the magnetic field collected on the winding during rotation of the rotor at constant speed are limited for the most part by the capacitor $C_A$. The quantity G which is affected by these variations is thus smoothed by said capacitor $C_A$, with the result that a higher degree of accuracy is provided in the low-speed detection device.

In the event that $V_1$ is the origin of the potentials (so that $V_1 = o$), that the coupling resistors between the points A of the windings and the common node M are equal to $R_L$, that the supplementary resistor between the node M and the potential $V_1$ is $R_A$, that m is the number of switches S opened at each instant, that n is the total number of windings, and that the quantity G is the voltage measured at the node M, namely $V_M$, the low-speed detection threshold is advantageously set at $$V_H = (1 + a) \frac{mRA}{nRA + RL} V_2$$

where a is a positive number of small value compared with the value corresponding to a normal speed of rotation nominal value $emf/V_2$.

Since this threshold value $V_H$ is taken as a reference potential, the low-speed signal will be triggered or not, depending on whether the voltage measured at M is lower than or higher than this reference potential.

Moreover, the device can be simplified by performing the aforementioned measurements only on two windings and not on all the windings, one of these windings being energized at each instant and the other being non-energized in alternate sequence.

It will be readily apparent that the invention is not limited to the examples described with reference to FIGS. 1 and 2 and that many modifications may accordingly be contemplated without thereby departing either from the scope or the spirit of the invention.

Thus the points A need not necessarily be associated with the windings. Electric leads can be so arranged as to ensure that the rotation of the magnet applies to these leads an alternating emf which will be representative of the speed of rotation of the motor and can be employed as a characteristic value of the speed of rotation.

Furthermore, the value G could be compared with a predetermined threshold in any manner other than by a comparator in order to trigger the low-speed signal.

The value G determined in accordance with the invention varies continuously and monotonically as a function of the speed of rotation of the motor. In consequence, this value is characteristic of the speed of rotation and could be employed, not on the all-or-none principle, but in a continuous manner, for example in order to indicate the value of the speed of rotation of the motor or for any other purpose without thereby departing from the broad purview of the present invention.

What is claimed is:

1. A direct current motor comprising at least two field windings (B1, B2), means for connecting a first end of each of said at least two windings to a first voltage terminal, means for connecting a second end of each of said at least two windings to a second voltage terminal through plural switches one individual to each of said windings, plural substantially invariable resistors one individual to each of said windings for connecting said second end of said winding to a common node other than said first and second terminals, an element which is rotatable with respect to the windings and has magnetic poles arranged for magnetically interacting with the field windings for producing a driving torque, and a speed sensing device having a measuring input connected to said common node, and means energizing at least one of said windings and maintaining unenergized at least one of said windings over substantially the entirety of a revolution of said element which is rotatable with respect to the windings.

2. A direct current motor according to claim 1, wherein the first and the second voltage terminals are respectively at the same voltage level for each of said at least two windings and the resistors through which the common node is connected to said at least two windings have the same ohmic value.

3. A direct current motor according to claim 1, wherein the speed sensing device comprises means for comparing the measuring input voltage with a given voltage threshold corresponding to a given speed threshold, and means for interrupting the current to the windings if the speed of said element with respect to the windings is below the speed threshold.

4. A direct current motor according to claim 3, wherein the comparing means comprise a comparator having an input connected to the common node and connected to a third voltage terminal through a resistor.

5. A direct current motor according to claim 4, wherein said input of the comparator is connected to the third voltage terminal through a capacitor.

6. A direct current motor according to claim 3, comprising means for delaying interruption of the current to the windings by the current interrupting means after the comparing means have detected the speed of the element to be below the speed threshold.

7. A direct current motor according to claim 6, wherein the current interrupting means comprise means for opening the switches of all the field windings.

8. A direct current motor according to claim 7, wherein the voltage threshold is such that the voltage in common node M when both switches are open causes the comparing means to allow current through the windings, and wherein means are provided for delaying restoring of current through the windings after an interruption controlled by the comparing means.

* * * * *